United States Patent

[11] 3,619,655

[72] Inventor Paul M. Cunningham
Richardson, Tex.

[21] Appl. No. 886,505

[22] Filed Dec. 19, 1969

[45] Patented Nov. 9, 1971

[73] Assignee Collins Radio Company
Cedar Rapids, Iowa

[54] NOISE PARALLELED SIGNAL SERIESED MULTISTAGED AMPLIFIER
7 Claims, 1 Drawing Fig.

[52] U.S. Cl. .................... 307/254, 307/219, 330/124 D, 343/742

[51] Int. Cl. .................... H03k 17/00

[50] Field of Search .................... 330/124, 124 D, 148; 307/219; 343/867

[56] References Cited

UNITED STATES PATENTS

| | | | |
|---|---|---|---|
| 3,075,153 | 1/1963 | Dodd et al .................... | 328/224 |
| 3,209,164 | 9/1965 | De Witt, Jr. .................... | 307/232 |
| 3,243,585 | 3/1966 | Escobosa .................... | 330/124 D2 |

*Primary Examiner*—Donald D. Forrer
*Assistant Examiner*—B. P. Davis
*Attorneys*—Warren H. Kintzinger and Robert J. Crawford

ABSTRACT: A noise paralleled signal seriesed multistaged amplifier with a plurality of transistors each with an antenna sensed AC signal connection to the base as a control element input and with this including a DC bias connection through an individual antenna wire conductor and with these antenna wires insulated mutually from each other. Each transistor includes a collector connection to a voltage supply, and an emitter follower connection through an individual transformer primary coil to ground. The transformer secondary coils are connected in series in a signal output circuit to, in combination, provide the desired device noise paralleled and signal seriesed result for an optimized system signal to noise ratio in the output from an H-vector loop VLF-LF antenna to amplifier system.

PATENTED NOV 9 1971
3,619,655
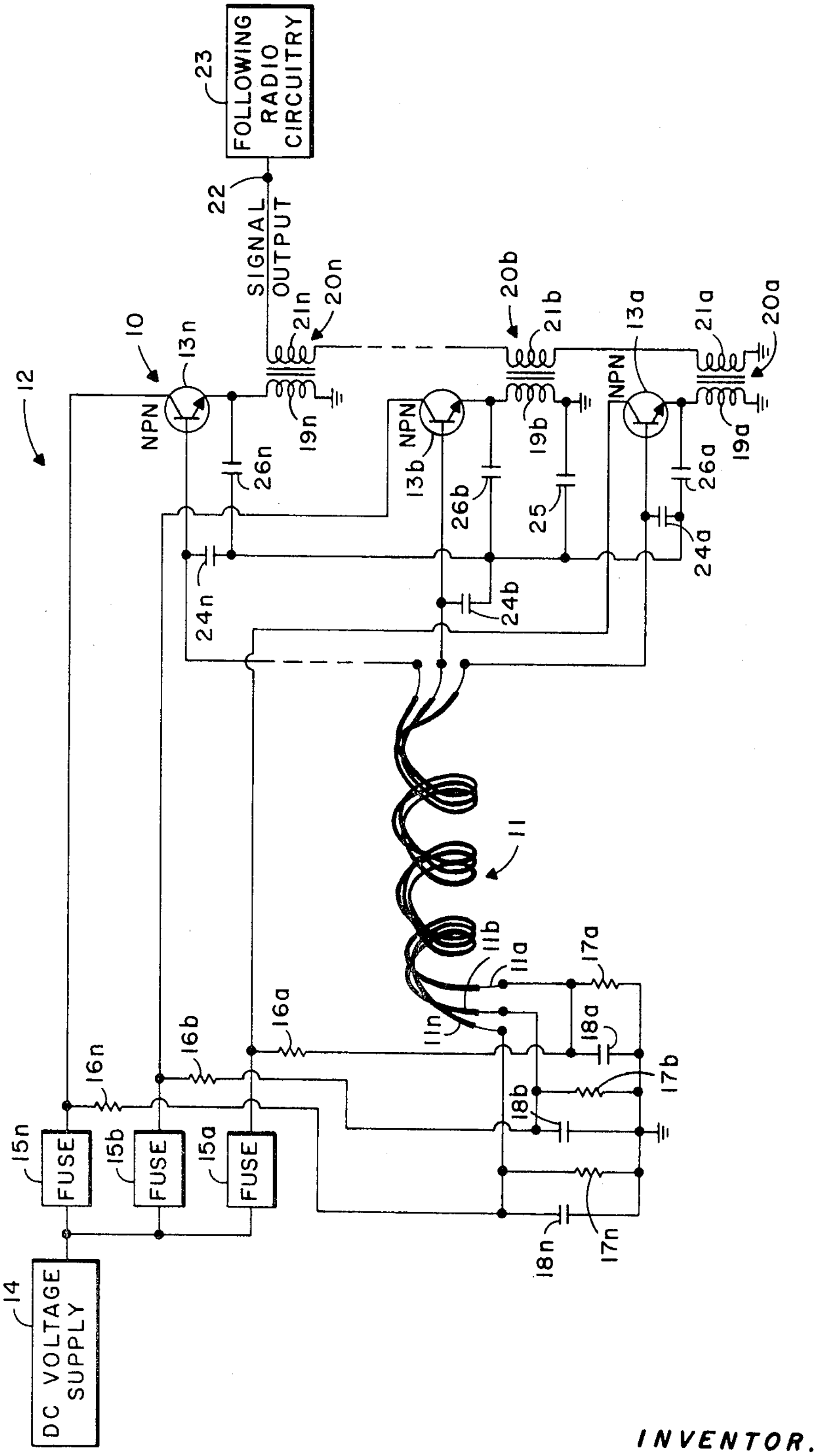
INVENTOR.
PAUL M. CUNNINGHAM
BY Warren H. Kintzinger
ATTORNEY

NOISE PARALLELED SIGNAL SERIESED MULTISTAGED AMPLIFIER

This invention relates in general to multistaged signal amplifying systems, and in particular, to a noise paralleled signal seriesed multisolid state device staged amplifier.

Amplifier circuits employing solid state amplifying devices have proven to be limited in application particularly in VLF and LF usage. This is occasioned through the existence of series noise equivalent factors of between 400 to 600 ohms with, generally, all currently available semiconductors. This is quite excessive particularly when related to the much lower series noise equivalent factor range of from 50 to 100 ohms existing with many vacuum tubes readily available today. Furthermore, the H-vector antenna circuit to single input amplifying device followed by multiple independent receivers employed with many VLF and LF systems is a weak link. Use of a single device in the first amplification stage is a critical threat to the communication mission. Redundant reliability is inherent in this paralleled AC input and series signal output multiple device first stage amplifier system. Catastrophic failure of the system following the failure of a single device is precluded.

It is therefore, a principal object of this invention to attain semiconductor amplifier noise performance approaching the optimum obtainable with vacuum tube amplifiers particularly in VLF and LF radio receiver usage.

Another object is to provide RF receiver amplifier first stage redundancy particularly for signal input sensed via an H-vector loop antenna system.

Features of this invention useful in accomplishing the above objects include use, in the first amplifier staging of an H-vector responding loop antenna and radio VLF and LF receiver system, of a plurality of semiconductor RF amplifying devices with parallel AC inputs and series connected AC outputs. This is with output signal components adding directly on a voltage basis and with, however, the series noise components adding in the output on a power basis only as the root of the sum of the squares. With the individual devices (transistors in the illustrated embodiment) being separate, their noise equivalents are not correlated and are statistically independent. When a number of transistors, or other such amplifying devices, are connected in this fashion the usual noise equivalent circuits are valid but with the series noise equivalent factor ($R_a$) divided by the number of transistors so employed. A noise-paralleled signal seriesed circuit configuration is actually presented particularly adapted, as such, for operation through the VLF and LF regions of operation but not so at higher frequencies since shunt impedances rather than the series noise impedances become predominate as limiting consideration for such higher frequency above VLF and LF usage. Complete DC isolation is provided through individual parallel circuits for each paralleled transistor through an H-vector loop antenna as a DC to transistor base bias connection. The signal output seriesed relation is attained through signal series connecting the secondary coils of signal coupling transformers individually associated with each transistor. With transistors so paralleled failure of one or several out of many so paralleled does not constitute a complete amplifier failure but advantageously provides a graceful failure mode in place of, otherwise, with single first stage device amplifies a complete catastrophic failure mode. This is particularly important since redundant reliability is especially important in usage where equivalent may be inaccessable for example in a flying device while in flight.

A specific embodiment representing what is presently regarded as the best mode of carrying out the invention is illustrated in the accompanying drawing.

In the single FIGURE of the case the noise paralleled signal seriesed multistaged amplifier circuit 10 for an H-vector responding loop antenna 11 and radio VLF and LF receiver system 12 a plurality of like NPN transistors **13*a*, 13*b*, through to 13*n* are employed. The DC voltage supply 14 is connected through fuse devices 15*a*, 15*b*, and 15*n*, that may include additional impedance means (not shown) as part of voltage dividing networks, to the collectors of NPN transistors 13*a*, 13*b*, and 13*n* respectively. Voltage dividing networks including, serially, resistors 16*a*, 16*b*, and 16*n* and then, resistors 17*a*, 17*b*, and 17*n* in parallel with capacitors 182, 18*b*, and 18*n*, respectively, are connected from the fuse devices 15*a*, 15*b*, and 15*n* to ground. The respective junctions of the resistors 16 and 17 are connected through individual wires 11*a*, 11*b*, and 11*n*, of what may a Litz intertwined wire configuration, in the loop antenna 11 to, respectively, the bases of NPN transistors 13*a*, 13*b*, and 13*n*. The emitters of transistors 13*a*, 13*b*, and 13*n* are connected, respectively, through primary coils 19*a*, 19*b*, and 19*n*, of transformers 20*a*, 20*b*, and 20*n*, to ground. The secondary coils 21*a*, 21*b*, and 21*n*, of transformers 20*a*, 20*b*, and 20*n*, are series connected, however, between ground and a signal output terminal 22 for further amplification through additional radio receiver circuitry 23** or other utilizing circuitry as may be appropriate.

The individual emitter follower coil **19*a*, 19*b*, and 19*n* connected transistors 13*a*, 13*b*, and 13*n*, parallel signal input connected via separate individual loop antenna wires 11*a*, 11*b*, and 11*n*, also part of bias circuits individual to respective transistors, and the series connected secondary coils 21*a*, 21*b*, and 13*n* quite advantageously provide a paralleled signal input and noise paralleled signal output seriesed amplifier first stage circuit. The base signal input connections of transistors 13*a*, 13*b*, and 13*n* are connected respectively through capacitors 24*a*, 24*b*, and 24*n* to a common connection to and through capacitor 25 to ground. The emitters of transistors 13*a*, 136, and 13*n* are connected, respectively, through capacitors 26*a*, 26*b*, and 26*n* to the common junction of capacitors 24*a*, 24*b*, and 24*n*, and capacitor 25**.

Please keep in mind that with operation of amplifier circuits in such usage with low-impedance loop antennas that the amplifiers are constrained by the series noise equivalent $R_a$ of the available amplifing devices. This series noise equivalent factor $R_a$ 1 generally falls in the range of from 400 to 600 ohms with currently available semiconductors as opposed to the much lower series noise equivalent of 50 to 100 ohms provided with vacuum tubes readily available. Operation of applicant's circuit with several devices having paralleled AC inputs and series connected AC signal outputs is particularly uniquely suited to herebefore existing problems of this nature with operation through the VLF and LF ranges. Output signal components add directly on a voltage basis in a circuit having no effect on the relative magnitude of the signal to the intrinsic and shunt impedance noise. It is an important improvement, however, that at the output, the series noise components add on a power basis only, as the root of the sum of the squares, and since the individual devices are separate their noise equivalents are statistically independent and not correlated. Thus, when N devices are connected in this fashion the usual noise equivalent circuit analysis is valid with, however, $R_a$ divided by N. With the series noise equivalent factor $R_a$ divided by the number of paralleled devices the advantageously noise paralleled and signal seriesed output circuit particularly useful for the VLF and LF regions is so configured for optimizing operation in these lower frequency regions as to become progressively less effective with any move to higher frequencies from the VLF and LF regions of operation. This is so since at high-frequency shunt impedances rather than series noise impedance become the predominant noise performance limiting considerations. With the particular circuit shown the transistor inputs are parallel connected insofar as the AC signal input is concerned. Please note, that generally simple DC parallel operation is recognized as being undesirable since on a DC basis it is almost impossible to get an assembly of transistors to equally participate. Usually at least one transistor "hoggs" the bias with others of the circuit being biased starved. A problem of component matching is imposed to an impractical if not impossible degree.

With applicant's circuit complete DC isolation is provided through individual circuits for each parallel transistor through the loop antenna as shown in the drawing and as described hereinbefore. This requires a multifilar winding that may be wound with Litz wiring for improved Q and with individual DC paths through the loop inductors of the antenna for the individual biasing of the paralleled first stage inputs. Then with the series AC signal output connections via the transformer signal couplings to series connected secondary coils, it becomes apparent that with the removal of, relatively speaking, just a few of a considerable number of such paralleled devices from operation in the circuit has only a relatively small detrimental lessening effect on the signal to noise performance of the amplifier system. This is so with respect to most of the coverage area, and the slight resulting drop in sensitivity with such removal of a few of the paralleled devices, for any reason that this may occur, is such as to have, practically speaking, no material adverse effect on communication performance. This, quite obviously, is certainly much less serious than is occasioned by the loss of one input transistor in an antenna input stage using only one such input transistor device. Further, with paralleled devices in applicant's circuit failure of one or more does not constitute a complete failure of the amplifier with, thereby, a graceful failure mode presented in place of, with some other antenna to amplifier systems, what constitutes complete catastrophic failure with single input device systems. It is advantageously possible with the system to independently monitor the circuit individual device DC operating currents to evaluate probable integrity. Sensing in the fashion presented by applicant could also include crowbar and/or fuse isolation of individual stages as a protective means against the possibility of a shorted device by EMP or other operational phenomenal. Furthermore, the redundant reliability in applicant's circuit is quite important during operation such as with the circuit being inaccessible, for example, in flight installation, providing continued resonable insurance of successful operational performance.

Whereas this invention is here illustrated and described with respect to a specific embodiment thereof, it should be realized that various changes may be made without departing from the essential contributions to the art made by the teachings hereof.

I claim:

1. In a noise paralleled signal seriesed multisolid state device amplifier system, a plurality of solid state devices having at least three electrodes, a first electrode, a second, and a third electrode; voltage connective means to each of said first electrodes; individual DC voltage bias connective circuit means to each of said second electrodes, and with said second electrodes a control electrode for each of said respective solid state devices; transformer primary coils individually connected respectively between each of said third electrodes and a voltage potential reference source; an RF signal sensing element individually included in each of said individual DC voltage bias connective circuit means; transformer secondary coils individually in signal coupling relation to said transformer primary coils; with a plurality of transformer secondary coils series connected in a signal output circuit; and wherein said RF signal sensing elements are individual antenna line conductors mutually insulated from each other.

2. The noise paralleled signal seriesed multisolid state device amplifier system of claim 1, wherein said individual antenna line conductors are each connected to individual bias means at antenna line conductor ends remote from connections thereof, respectively, to said second electrodes of the solid state devices.

3. The noise paralleled signal seriesed multisolid state device amplifier system of claim 2, wherein said individual bias means each include a voltage divider from a voltage supply.

4. The noise paralleled signal seriesed multisolid state device amplifier system of claim 3, wherein said voltage supply is a common voltage supply connected to said voltage connective means to each of said first electrodes.

5. The noise paralleled signal seriesed multisolid state device amplifier system of claim 1, wherein said solid state devices are transistors with said first electrode a transistor collector, said second electrode a transistor base, and said third electrode an emitter; and with the emitter of each transistor connected through a transformer coil to said voltage potential reference source in an emitter follower configuration.

6. The noise paralleled signal seriesed multisolid state device amplifier system of claim 5, wherein said transistors are NPN transistors, and said voltage potential reference source is ground.

7. The noise paralleled signal seriesed multisolid state device amplifier system of claim 6, wherein said signal output circuit includes series connection of said transformer secondary coils between ground and signal output connective means.

* * * * *